United States Patent
Josephson et al.

(10) Patent No.: US 7,321,482 B2
(45) Date of Patent: Jan. 22, 2008

(54) SUB-CIRCUIT VOLTAGE MANIPULATION

(75) Inventors: Don Douglas Josephson, Fort Collins, CO (US); Samuel D. Naffziger, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 478 days.

(21) Appl. No.: 10/804,624

(22) Filed: Mar. 19, 2004

(65) Prior Publication Data

US 2005/0207076 A1    Sep. 22, 2005

(51) Int. Cl.
H02H 9/00 (2006.01)
G01R 19/18 (2006.01)
G01R 19/22 (2006.01)

(52) U.S. Cl. .......................... 361/56; 324/118
(58) Field of Classification Search ................. 361/56; 324/118
See application file for complete search history.

(56) References Cited

U.S. PATENT DOCUMENTS

| | | | |
|---|---|---|---|
| 4,528,505 A | 7/1985 | Peterson | |
| 5,083,096 A * | 1/1992 | Miyazaki | .......... 330/279 |
| 5,644,609 A | 7/1997 | Bockhaus et al. | |
| 5,675,546 A | 10/1997 | Leung | |
| 5,682,352 A | 10/1997 | Wong et al. | |
| 5,867,644 A | 2/1999 | Ranson et al. | |
| 6,169,408 B1 | 1/2001 | Kantor et al. | |
| 6,169,694 B1 | 1/2001 | Nam et al. | |
| 6,314,530 B1 | 11/2001 | Mann | |
| 6,374,370 B1 | 4/2002 | Bockhaus et al. | |
| 6,378,092 B1 | 4/2002 | Josephson | |
| 6,397,354 B1 | 5/2002 | Ertekin | |
| 6,496,028 B1 | 12/2002 | Manhaeve et al. | |
| 6,633,838 B1 | 10/2003 | Arimilli et al. | |
| 6,747,776 B2 * | 6/2004 | Fujii et al. | .......... 359/240 |
| 2001/0054910 A1 | 12/2001 | Gilliam | |
| 2003/0057986 A1 | 3/2003 | Amick et al. | |
| 2003/0062916 A1 | 4/2003 | Manhaeve et al. | |

FOREIGN PATENT DOCUMENTS

EP 0811989 A2 12/1997
JP 6082517 A2 3/1994

* cited by examiner

Primary Examiner—Stephen W. Jackson
Assistant Examiner—Dharti H Patel

(57) ABSTRACT

An integrated circuit is provided which in one embodiment includes a first sub-circuit coupled to a first power supply rail providing a first power supply voltage; a second sub-circuit coupled to a second power supply rail providing a second power supply voltage; and first power supply modulation means, coupled to the first sub-circuit, for modulating the first power supply voltage without modulating the second power supply voltage.

22 Claims, 5 Drawing Sheets

SUB-CIRCUIT VOLTAGE MANIPULATION

CROSS REFERENCE TO RELATED APPLICATIONS

This application is related to the following co-pending and commonly-owned U.S. patent applications, which are hereby incorporated by reference:

U.S. patent application Ser. No. 10/653,760, filed on Sep. 3, 2003, entitled "System and Method to Mitigate Voltage Fluctuations"; and U.S. patent application Ser. No. 10/646,935, filed on Aug. 22, 2003, entitled "Method and System to Temporarily Modify an Output Waveform."

BACKGROUND

Related Art

Testing is an extremely important part of integrated circuit design. Although it may be possible to identify and correct certain design errors using a software simulator to simulate operation of the circuit, some errors can only be detected by testing a physical prototype of the circuit. It is becoming increasingly difficult to diagnose failures in and to measure the performance of microprocessors and other integrated circuits as such circuits continue to increase in transistor density, clock frequency, and complexity. In particular, the ability to observe the internal state of microprocessors has become increasingly limited due to increasing circuit complexity and practical constraints on the number of external pads that can be provided on the chip package. As a result, it is becoming increasingly difficult to detect errors which affect the internal state of an integrated circuit but which do not propagate to external pins of the circuit.

One way to test an integrated circuit is to increase and/or decrease the supply voltage provided to the circuit and to observe the outputs of the circuit under such modified supply voltage conditions. One effect of increasing the supply voltage to an integrated circuit is to increase the operating frequency of the circuit. Supply voltage fluctuations may also, however, cause the circuit to malfunction, as may be detected when the circuit produces outputs that differ from the expected outputs given a known set of inputs. Failure of an integrated circuit to produce the correct output when powered with a supply voltage that falls within a predetermined range of supply voltages may be evidence of a manufacturing and/or design defect.

Such testing typically modulates the external supply voltage that is provided to the entire integrated circuit. One drawback of such an approach is that integrated circuits tend to respond to such modulations in external supply voltage very slowly, as package parasitics and the distance (measured in signal path length) from the power supply to internal components of the circuit preclude the ability to dynamically control the power that is provided to the device over very short time periods. External voltage supply modulation, therefore, provides limited opportunity to measure the effects of rapid power supply changes on internal components of the circuit.

Furthermore, external power supplies can typically only be set to different DC voltage levels. As a result, such power supplies typically have limited ability to dynamically introduce transient voltages into the integrated circuit. External voltage supply modulation, therefore, provides limited opportunity to measure the effects of transient voltages on internal circuit components.

SUMMARY

In one aspect of the present invention, an integrated circuit is provided which includes a first sub-circuit coupled to a first power supply rail providing a first power supply voltage; a second sub-circuit coupled to a second power supply rail providing a second power supply voltage; and first power supply modulation means, coupled to the first sub-circuit, for modulating the first power supply voltage without modulating the second power supply voltage.

Other features and advantages of various aspects and embodiments of the present invention will become apparent from the following description and from the claims.

DETAILED DESCRIPTION

Figure 1:
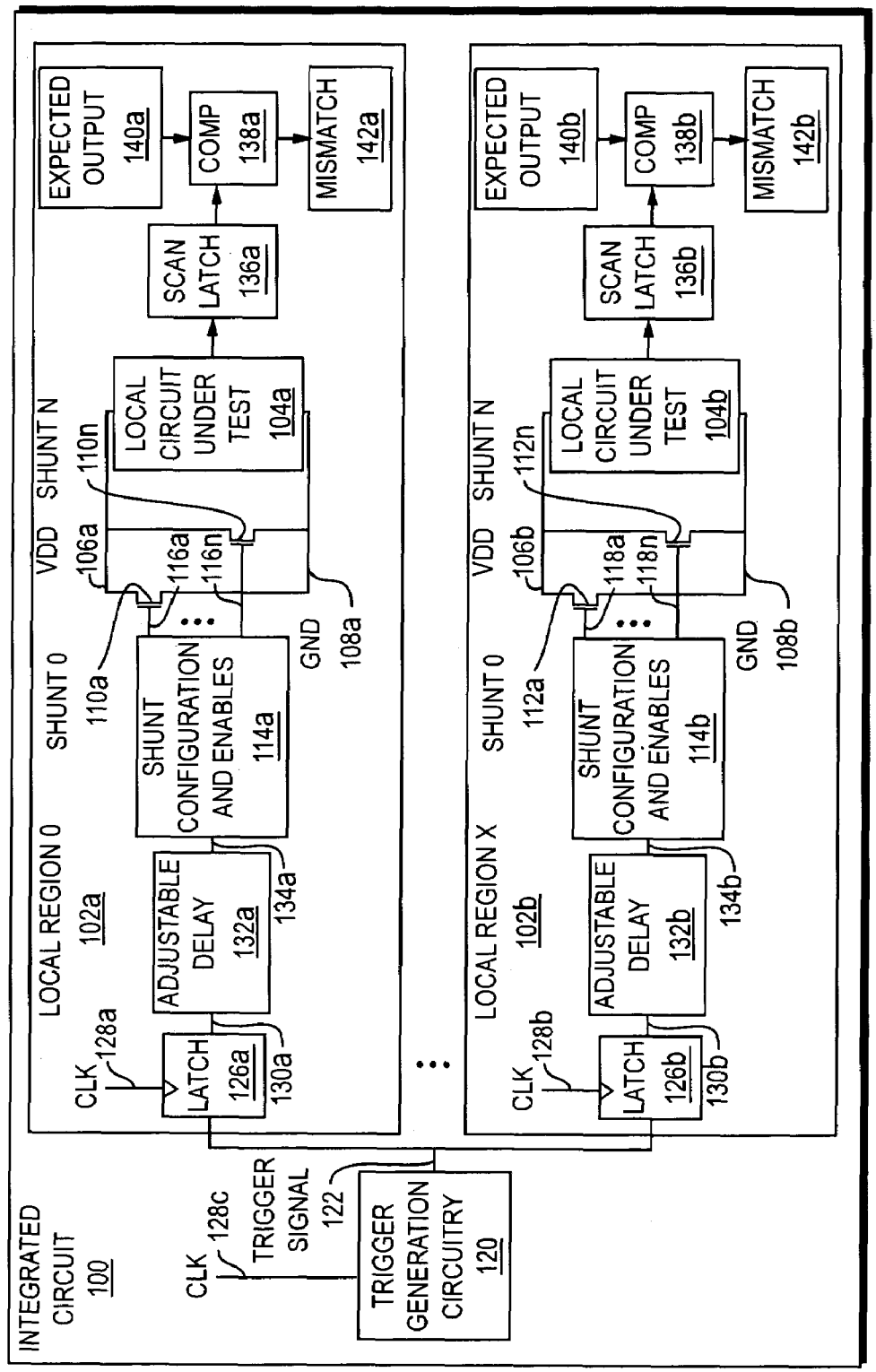
FIG. 1 is a schematic diagram of an integrated circuit including local power supply modulation circuitry according to one embodiment of the present invention.

Referring to FIG. 1, a schematic diagram is shown of an integrated circuit 100 (such as a microprocessor) including local power supply modulation circuitry according to one embodiment of the present invention. The integrated circuit 100 includes a plurality of local regions 102a-b. Although only two local regions 102a-b are shown in FIG. 1 for purposes of example, the integrated circuit 100 may include any number of local regions. Local regions 102a-b are not drawn to scale. Rather, local regions 102a-b may be of any size and may be located anywhere within the integrated circuit.

Local regions 102a-b include local circuits under test (CUTs) 104a-b, respectively. Each of the local CUTs 104a-b may be any sub-circuit of the integrated circuit 100 which is desired to be tested. As will be described in more detail below, the integrated circuit 100 includes circuitry for modulating the local power supply voltages provided to the local CUTs 104a-b and for testing the response of the CUTs 104a-b to such modulated power supply voltages. The local CUTs 104a-b, like the other elements in FIG. 1, are illustrated in block form for ease of illustration.

Local CUTs 104a-b are coupled between power supply rails 106a-b and grounds 108a-b, respectively. The power supply rails 106a-b may, for example, be coupled to a common power supply. Similarly, grounds 108a-b may, for example, be coupled to a common ground.

Shunt transistors 110a-n are coupled in parallel with local CUT 104a (i.e., between power supply rail 106a and ground 108a). Similarly, a plurality of shunt transistors 112a-n are coupled in parallel with local CUT 104b (i.e., between power supply rail 106b and ground 108b). Although only two shunt transistors 110a-n and 112a-n are shown in FIG. 1, each of the local regions 102a-b may include any number of shunt transistors. The number of shunt transistors may differ among local regions. Examples of other uses of the shunt transistors 110a-n and 112a-n are described in the above-referenced patent applications entitled "System and Method to Mitigate Voltage Fluctuations," and "Method and System to Temporarily Modify an Output Waveform."

Activating (turning on) one or more of the shunt transistors 110a-n causes the activated transistor(s) to draw current between the supply rail 106a and ground 108a, thereby locally lowering the voltage provided to local CUT 104a. Alternatively, higher voltage transients may be introduced in the local region 102a by first activating the shunts 110a-n for a relatively long period of time and then deactivating them. The same effects may be introduced for local CUT 104b by activating and/or deactivating one or more of the shunts 112a-n.

Local regions 102a-b also include shunt configuration and enable engines 114a-b, respectively, which control the activation and deactivation of shunts 110a-n and 112a-n, respectively. Engines 114a-b may, for example, implement finite state machines in a ROM or other circuitry.

As will be described in more detail below, each of the engines 114a-b may be configured to activate corresponding ones of the shunts 110a-n and 112a-n for predetermined periods of time. In general, engines 114a-b are coupled to enable lines 116a-n and 118a-n, respectively. Enable lines 116a-n are coupled to the gates of shunt transistors 110a-n, respectively, and enable lines 118a-n are coupled to the gates of shunt transistors 112a-n, respectively. Engine 114a may activate (i.e., turn on) selected ones of the shunt transistors 110a-n by asserting corresponding ones of the enable lines 116a-n. Similarly, engine 114b may activate selected ones of the shunt transistors 112a-n by asserting corresponding ones of the enable lines 118a-n.

Integrated circuit 100 also includes trigger generation circuitry 120, which may provide a trigger signal on line 122. Alternatively, trigger generation circuitry 120 may be external to the integrated circuit 100 and provide the trigger signal as an input to the integrated circuit 100. Trigger generation circuitry may be any kind of trigger generation circuitry, such as the kind disclosed in U.S. Pat. No. 5,867,644, entitled "System and Method for On-Chip Debug Support and Performance Monitoring in a Microprocessor," issued on Feb. 2, 1999, and incorporated by reference herein.

In general, a trigger generation circuit generates a trigger signal in response to the occurrence of a predetermined event in a circuit. One example of such an event is a timeout event, which occurs when a component such as a microprocessor fails to respond to a request within a predetermined period of time. A timeout event trigger signal may be generated in response to the occurrence of a timeout event to signal the occurrence of the timeout event. Another example is a trigger signal generated in response to the execution of a specific sequence or pattern of instructions. Integrated circuits typically include various trigger generation circuits for purposes of circuit testing and for enabling the integrated circuit to respond to errors. The trigger generation circuitry 120 may, for example, be a pre-existing trigger generation circuit in the integrated circuit 100 or in the same computer system as the integrated circuit 100.

Trigger signal line 122 is split into lines 124a-b, which are coupled to local regions 102a-b, respectively, thereby enabling the trigger signal on line 122 to be provided to both of the local regions 102a-b. Local regions 102a-b include latches 126a-b, respectively, which receive the trigger signal on lines 124a-b, respectively. Latches 126a-b are clocked by clock signals on clock lines 128a-b, respectively. Trigger generation circuitry 120 is clocked by a clock signal on clock line 128c. A common clock signal may be provided to latches 126a-b and trigger generation circuitry 120 on clock lines 128a-c, respectively.

Local regions 102a-b also include adjustable delay circuits 132a-b, respectively, which are coupled to the outputs of latches 126a-b on lines 130a-b, respectively. The delay circuits 132a-b may, for example, be analog delay circuits which may be individually configured to introduce desired amounts of analog delay into the latched trigger signals output by the latches 126a-b, respectively. The outputs of delay circuits 132a-b are coupled to the inputs of shunt configuration and enable engines 114a-b over lines 134a-b, respectively, thereby providing the delayed trigger signals to the engines 114a-b.

Figure 2:
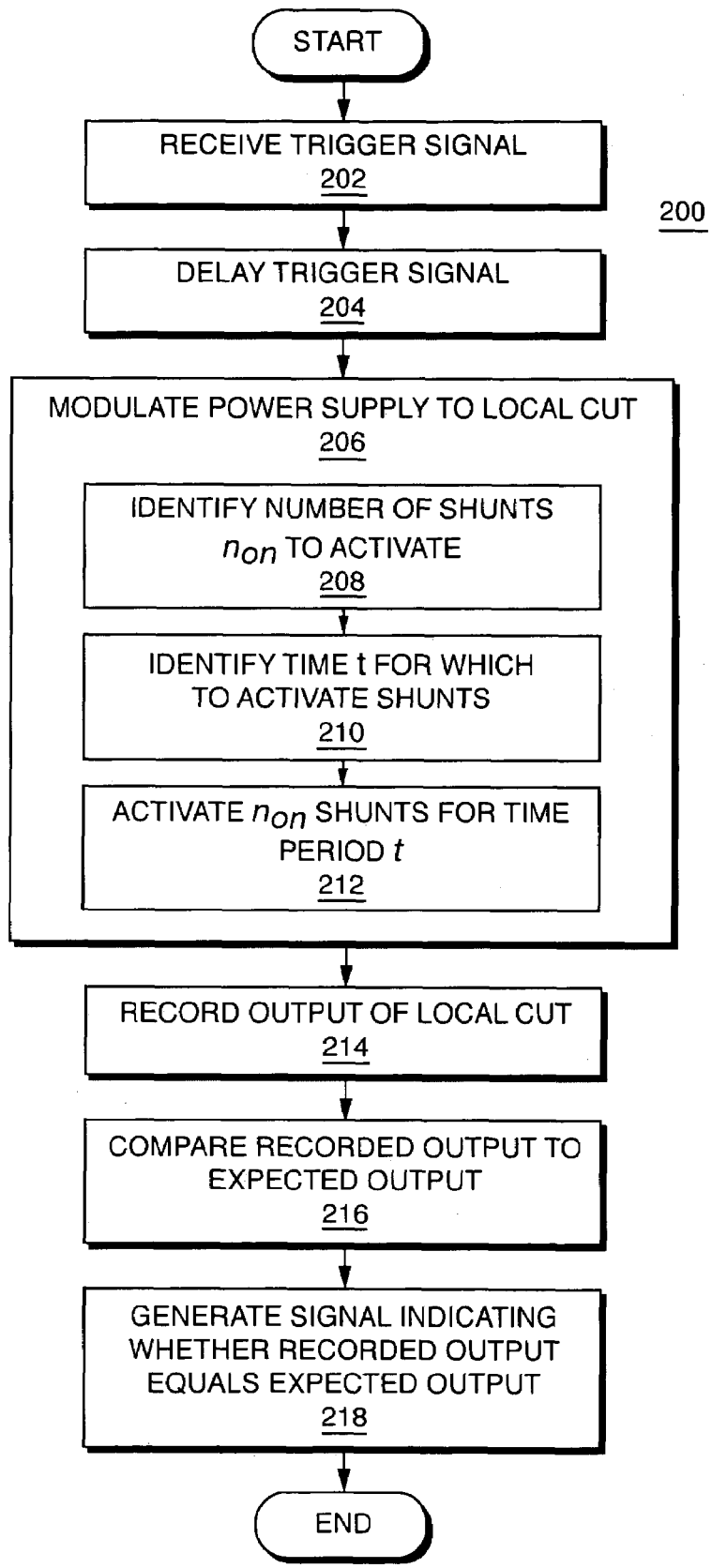
FIG. 2 is a flowchart of a method that is performed by components in each of local regions in the integrated circuit of FIG. 1 in one embodiment of the present invention.

Referring to FIG. 2, a flowchart is shown of a method 200 that is performed by components in a local circuit region, such as region 102a and/or 102b, in one embodiment of the present invention. The method 200 receives a trigger signal (step 202). For example, local region 102a may receive a trigger signal at latch 126a on line 124a from trigger generation circuitry 120. The method 200 delays the trigger signal by a predetermined delay period (step 204). This delay, which is optional, may be performed, for example, by the adjustable delay circuit 132a. Such a delay allows the trigger signal to be shifted within a clock cycle to test the effects of power transients introduced at different points during the clock cycle of the local circuit under test 104a.

The method 200 modulates the power supplied to the local circuit under test 104a (step 206). The supplied power may, for example, be increased or decreased. In the embodiment illustrated in FIG. 1, step 206 may be performed by the shunt configuration and enable engine 114a and the shunts 110a-n as follows.

The method 200 identifies the number of shunts $n_{on}$ to activate in response to the trigger signal (step 208). Each of the shunt configuration and enable engines 114a-b may, for example, include a register which stores a value representing the number of shunts $n_{on}$ to be activated in the corresponding one of the local regions 102a-b.

If the value $n_{on}$ is equal to zero for a particular local region, then none of the shunts in that region will be activated in response to generation of the trigger signal. Therefore, if it is desired to introduce power transients only into certain ones of the local regions 102a-b, the value of $n_{on}$ may be set to a non-zero value for those regions, and the value of $n_{on}$ may be set to zero for the remaining regions. Alternatively, the shunt configuration and enable engines 114a-b may contain a separate "shunt enable" value (which may be stored, for example, in register) which indicates whether or not the engine should activate any of the corresponding shunts. In such an implementation, the shunt enable and configuration engine in a particular local region would only activate the corresponding shunts if the corresponding "shunt enable" value so indicates. One use of such techniques is to test one of the local regions 102a-b at a time by successively configuring each of the engines 114a-b to activate its corresponding shunts while configuring all of the remaining engines not to activate their corresponding shunts.

The method 200 identifies the amount of time t for which to activate the identified number of shunts (step 210). In the embodiment illustrated in FIG. 1, the engines 114a-b activate the corresponding shunts for as long as the delayed trigger signals on lines 134a-b are asserted. Therefore, in the embodiment illustrated in FIG. 1, step 210 is performed implicitly. Alternatively, however, the engines 114a-b may be configured (using, for example, a value stored in a register) to activate the corresponding shunts for predetermined periods of time that are independent of each other and of the duration of the trigger signal.

The method 200 activates the identified number $n_{on}$ of shunts for time period t (step 212). In the embodiment illustrated in FIG. 1, the engine 114a may perform step 212 by asserting $n_{on}$ ones of the lines 116a-n, which are coupled to the gates of shunts 110a-n, thereby activating only $n_{on}$ shunts. The engine 114b may operate in a similar manner, although the value of $n_{on}$ may vary from local region to local region.

The method 200 records the output of the local CUT while the power to the CUT is being modulated (step 214). For example, referring to FIG. 1, the local regions 102a-b include scan latches 136a-b, which are coupled to the outputs of local CUTs 104a-b, respectively. As is well-known to those of ordinary skill in the art, the outputs of the local CUTs 104a-b may be shifted into the scan latches 136a-b, respectively, at selected times, thereby recording the outputs of the local CUTs 104a-b at those times. In one embodiment of the present invention, one or more outputs of the local CUTs 104a-b are shifted into the scan latches 136a-b during modulation of the power supplied to the local CUTs, thereby implementing step 214.

The method 200 compares the recorded output of the local CUT to the expected output of the local CUT (step 216). For example, referring to FIG. 1, the local regions 102a-b include comparators 138a-b, which are coupled to the outputs of scan latches 136a-b, respectively. Comparators 138a-b thereby receive as input the recorded outputs of the local CUTs 104a-b, respectively. Note that although the scan latches 136a-b and comparators 138a-b are illustrated within the local regions 102a-b, they may alternatively be located outside of the integrated circuit 100.

Comparators 138a-b also receive as input the expected outputs 140a-b of the local CUTs 104a-b, respectively. As is well-known to those of ordinary skill in the art, the expected output of a circuit such as a microprocessor may be identified using a circuit simulator which simulates the operation of the circuit. When such a simulator is instructed to simulate the operation of the circuit when provided with particular inputs, the simulator may indicate the outputs expected to be produced by the circuit.

The comparators 138a-b may compare the recorded outputs of the local CUTs 104a-b (as output by the scan latches 136a-b) to the expected outputs 140a-b of the local CUTs 104a-b, and produce mismatch signals 142a-b which indicate whether the recorded outputs are equal to the expected outputs 140a-b (step 218). The values of the mismatch signals 142a-b, along with information about the power transients and circuit inputs which produced the mismatch signals 142a-b, may be reported to the circuit tester so that appropriate corrective action may be taken in response.

Figure 4:
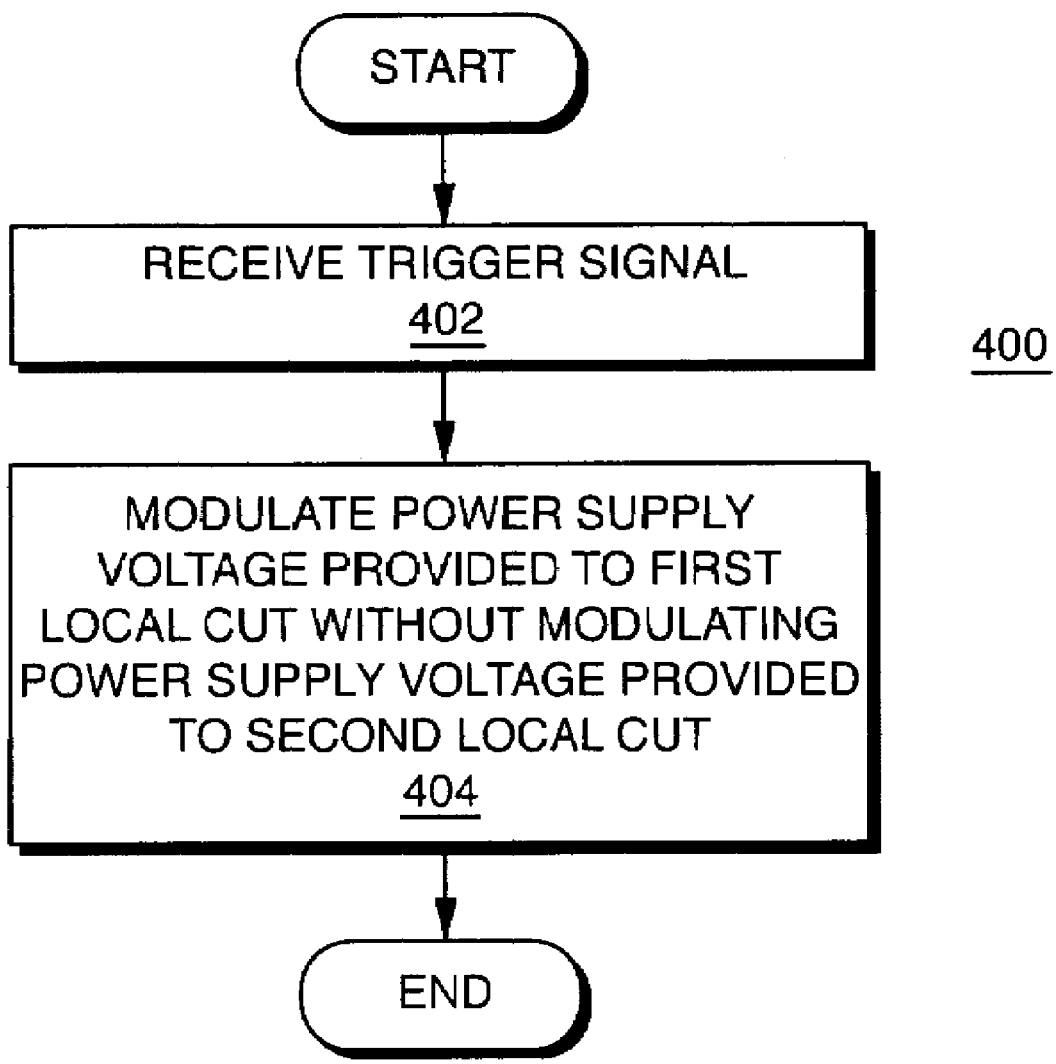
FIG. 4 is a flowchart of a method for use of an integrated circuit in one embodiment of the present invention.

Note that the techniques disclosed with respect to FIG. 2 may be used to modulate the power supply voltages provide to local CUTs 104a and 104b independently of each other. For example, referring to FIG. 4, a flowchart is shown of a method 400 that is performed by components in a local circuit region, such as region 102a and/or 102b, in one embodiment of the present invention. The method 400 receives a trigger signal (step 402), such as in the manner described above with respect to step 202 of method 200 in FIG. 2. The method 400 modulates the power supply voltage provides to local CUT 104a without modulating the power supply voltage provided to local CUT 104b (step 404). Step 404 may, for example, be performed in the manner described above with respect to step 206 of method 200 in FIG. 2.

In a microprocessor with multiple processor cores, it can be advantageous to use the techniques just described to test the cores in the following manner. The same code sequence may be executed on two cores, with the first core receiving a normal power supply voltage and the second core receiving a modified power supply voltage using the techniques disclosed above. The output of the first core may be used as a reference output which is compared to the output of the second core using the techniques described above.

In a single-core microprocessor, a code sequence may be executed on the microprocessor at an operating point where the microprocessor is known to function correctly. The output of the microprocessor at this operating point may be recorded as a reference output. The same code sequence may then be executed on the microprocessor at various other operating points and the resulting outputs compared to the reference output using the techniques described above.

Figure 3:
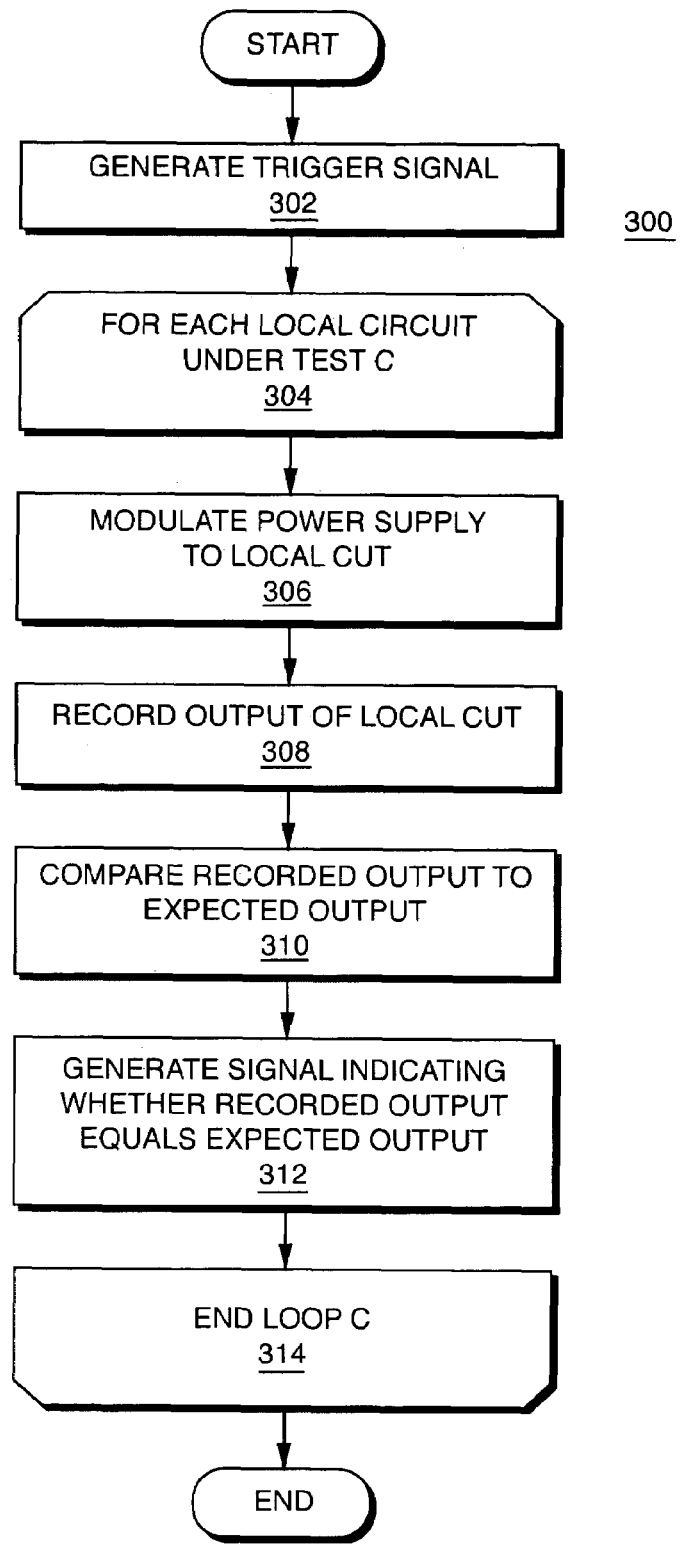
FIG. 3 is a flowchart of a method that is performed by the integrated circuit of FIG. 1 in one embodiment of the present invention to modulate the supply voltages provided to a plurality of local circuits under test in the integrated circuit.

The method 200 illustrated in FIG. 2 is performed by a single one of the local regions 102a-b to modulate the supply voltage provided to a single circuit under test. Referring to FIG. 3, a flowchart is shown of a method 300 that is performed by the integrated circuit 100 in one embodiment of the present invention to modulate the supply voltages provided to a plurality of circuits under test in the integrated circuit 100.

The method 300 generates a trigger signal (step 302). Referring to FIG. 1, step 302 may be performed by the trigger generation circuitry 120. Alternatively, off-chip trigger generation circuitry may generate a trigger signal which is received by the integrated circuit 100.

For each circuit C in a plurality of circuits under test (step 304), the method 300: (1) modulates the power supplied to circuit C in response to the trigger signal (step 306); (2) records the output of circuit C (step 308); (3) compares the recorded output of circuit C to the expected output of circuit C (step 310); and (4) generates a signal indicating whether the recorded output equals the expected output (step 312). Steps 306-312 may be performed in the same manner as steps 206, 214, 216, and 218, respectively, of method 200 (FIG. 2). Upon performing steps 306-314 for each of the local CUTs (step 314), the method 300 terminates.

Note that the method 300 enables a single trigger signal to trigger the introduction of local power transients into the plurality of local regions 102a-b. Even though a single trigger signal is used, different power transients may be introduced into each of the local regions 102a-b for different amounts of time using the techniques described above with respect to FIG. 2.

Figure 5:
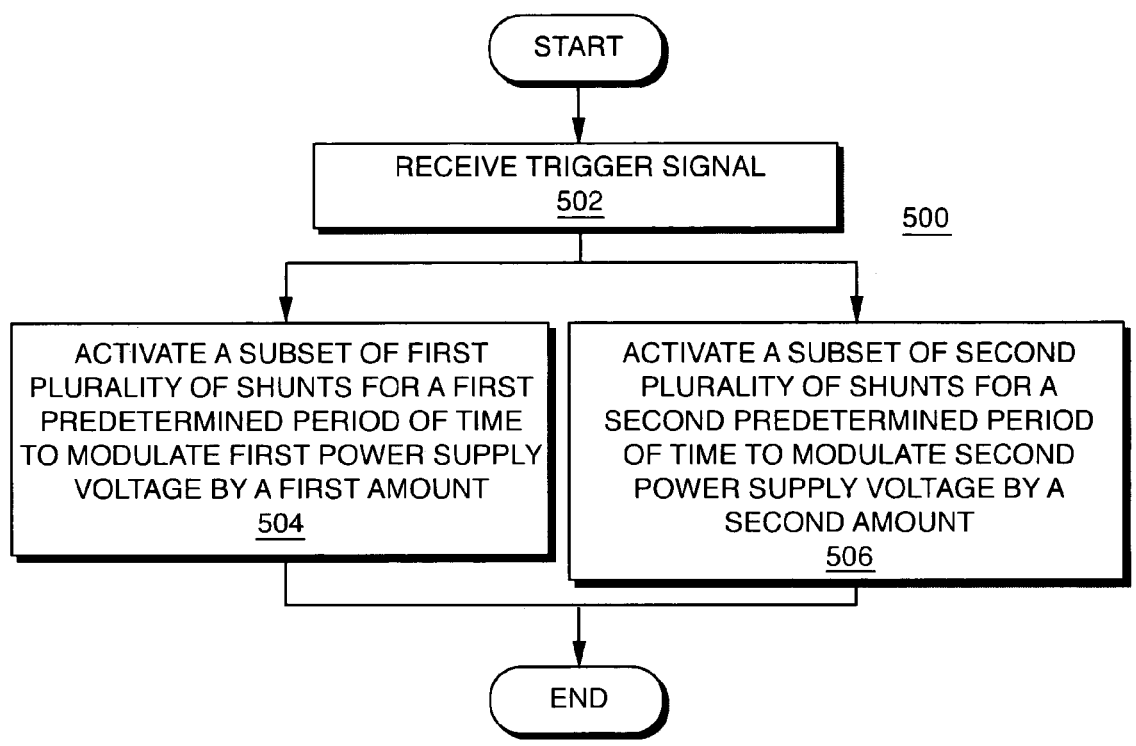
FIG. 5 is a flowchart of a method for use of an integrated circuit in another embodiment of the present invention.

For example, referring to FIG. 5, a flowchart is shown of a method 500 for use of the integrated circuit 100 in one embodiment of the present invention. The method 500 receives a trigger signal (step 502), such as in the manner described above with respect to step 202 of method 200 in FIG. 2. In response to receipt of the trigger signal, the method contemporaneously: (A) activates a subset of shunts 116a-n for a first predetermined period of time to modulate the power supply voltage provided to CUT 104a by a first amount (step 504); and (B) activates a subset of shunts 118a-n for a second predetermined period of time to modulate the power supply voltage provided to CUT 104b by a second amount (step 506). Each of steps 504 and 506 may be implemented in the manner described above with respect to step 206 of method 200 in FIG. 2.

As described above, conventional techniques for testing the effects of power modulation on the operation of an integrated circuit typically modulate the external supply voltage that is provided to the entire integrated circuit. For the reasons described above, however, external voltage supply modulation provides limited opportunity to measure the effects of rapid power supply changes on internal components of the circuit. Techniques disclosed herein, in contrast, allow the systematic exploration of circuit voltage sensitivities in an integrated circuit in a dynamic fashion. In particular, techniques disclosed herein enable power transients to be introduced within specified local regions of an integrated circuit for specified periods of time, thereby enabling the effects of power fluctuations to be measured with much finer control than is possible using conventional techniques.

The techniques disclosed herein may be particularly useful during debug of the design of an integrated circuit. Debug of the design is necessary to determine proper operating margins and specifications for the integrated circuit, and such debug may lead to identification of marginal sub-circuits which may be redesigned to operate over a wider specification range. Techniques disclosed herein may aid in the identification of such marginal circuits more quickly and accurately than traditional techniques, thereby resulting in improved time-to-market for products. In particular, the ability to introduce power transients into specified sub-circuits in particular local regions, without affecting other sub-circuits in other local regions, facilitates the identification of which region in the has failed and the conditions under which such failure has occurred.

The input conditions under which a particular local circuit under test has failed may be identified by, for example, providing a sequence of inputs to the integrated circuit 100 and using the trigger generation circuitry 120 to generate a trigger signal only at the time that the first one of the inputs is provided to the integrated circuit 100. The operation of the integrated circuit 100 may be tested using the comparators 138a-b in the manner described above. The same set of inputs may then be provided to the integrated circuit 100, but this time with the trigger signal generated at the time that the second one of the inputs is provided to the integrated circuit 100. The operation of the integrated circuit 100 may then again be tested using the comparators 138a-b. Such a sequence of operations may be repeated for each of the inputs. If an error is identified during a particular test run, the input which produced the error may be identified because it is known from the test design that voltage transients were introduced only during processing of a particular input by the integrated circuit. Such techniques make it possible to identify with a high degree of precision the particular conditions under which particular local regions of the circuit 100 fail, thereby facilitating correction of the circuit design.

Another disadvantage of conventional techniques is that it can be difficult or impossible to use them to introduce "worst case" transient voltage conditions on the internal voltage grid of an integrated circuit. It is important, however, to test various regions within the integrated circuit under such worst case conditions to determine whether the device will operate properly in the field under such conditions. The techniques disclosed herein allow an integrated circuit to be systematically explored for "worst case" voltage transient susceptibility within internal circuits, by configuring the amounts of shunting current drawn by the shunt transistors. More generally, the ability to configure the number of activated shunts and their activation period allows very fine-grained control over the amount of voltage transient that is introduced, thereby enabling more accurate determinations of the precise limits of the conditions under which the circuit is capable of operating correctly.

There are also advantages to using a single trigger signal (e.g., the trigger signal generated by the trigger generation circuitry 120) to trigger the introduction of voltage transients in the plurality of local regions 102a-b. One such advantage it is simpler to use a single trigger signal to trigger the introduction of voltage transients into a plurality of local regions that it is to use a plurality of signals. By clocking the trigger generation circuitry 120 and the voltage modulation circuitry in the local regions 102a-b with a common clock signal, the timing of the power transients introduced in the local regions may be controlled precisely. Furthermore, adjustments to such timing may be controlled individually and precisely in each of the regions 102a-b using the adjustable delay circuits 132a-b, without forgoing the advantages of the single trigger signal. Furthermore, the shunt configuration and enable engines 114a-b may be configured to enable or disable the activation or deactivation of the corresponding shunts, thereby providing further control on a region-by-region basis over the introduction of power transients, without forgoing the advantages of the single trigger signal.

It is to be understood that although the invention has been described above in terms of particular embodiments, the foregoing embodiments are provided as illustrative only, and do not limit or define the scope of the invention. Various other embodiments, including but not limited to the following, are also within the scope of the claims. For example, elements and components described herein may be further divided into additional components or joined together to form fewer components for performing the same functions.

The integrated circuit 100 may be any kind of integrated circuit, such as a microprocessor. Although particular examples of the trigger generation circuit 120 are disclosed in the above-referenced patent entitled "System and Method for On-Chip Debug Support and Performance Monitoring in a Microprocessor," the circuitry 120 may be any kind of trigger generation circuitry. Furthermore, although trigger generation circuitry often generates trigger signals in response to the occurrence of predetermined events within an integrated circuit, the trigger generation circuitry 120 may generate a trigger signal based on any kind of event. For example, as described above, the trigger generation circuitry 120 may be specifically controlled to generate trigger signals at desired times. Therefore, more generally, the trigger generation circuitry 120 is merely one example of a signal generator that may be used in conjunction with the techniques disclosed herein.

Furthermore, although the trigger generation circuitry 120 illustrated in FIG. 1 shares a common clock signal with latches 128a-b, this is not a requirement of the present invention. In addition, the integrated circuit 100 may include multiple trigger generation circuits, each of which may be coupled to one or more local regions in the integrated circuit 100. Such trigger generation circuits may be synchronous or asynchronous with respect to each other.

The local circuits under test 104a-b may be any kinds of sub-circuits of the integrated circuit 100. The integrated circuit 100 may include any number of local regions, each of which may include one or more local circuits under test.

The adjustable delay circuits 132a-b are optional and may be implemented in any manner. Those of ordinary skill in the art will appreciate how to implement analog delay circuitry for delaying the trigger signal by any desired amount. Furthermore, the adjustable delay circuits 132a-b may alternatively be implemented as digital delay circuits using techniques that are well-known to those of ordinary skill in the art. Although the particular shunts 110*a-n* and 112*a-n* illustrated in FIG. 1 are transistors, this is not a requirement of the present invention. Rather, any kind(s) of shunts may be used.

The shunt configuration and enable engines 114*a-b* may be implemented in hardware, software, firmware, application specific integrated circuits (ASICs), field-programmable gate arrays (FPGAs), custom-purpose analog or digital circuitry, or any combination thereof. For example, the engines 114*a-b* may be implemented simply as scan latches, each of which controls whether voltage manipulation is to be performed in the corresponding local region. As another example, the engines 114*a-b* may be microcontrollers which produce pre-programmed voltage manipulations over time, such as by turning on an increasing number of shunts over time until a failure is detected.

What is claimed is:

1. An integrated circuit comprising:
   a first sub-circuit coupled to a first power supply rail providing a first power supply voltage;
   a second sub-circuit coupled to a second power supply rail providing a second power supply voltage;
   a first power supply modulator, coupled to the first sub-circuit and comprising a first plurality of shunts coupled to the first power supply rail, the modulator modulating the first power supply voltage without modulating the second power supply voltage; and
   a first shunt controller, coupled to the at least one first shunt, comprising means for activating a predetermined subset of the first plurality of shunts.

2. The integrated circuit of claim 1, wherein the first power supply modulator comprises means for increasing the first power supply voltage.

3. The integrated circuit of claim 1, wherein the first power supply modulator comprises means for decreasing the first power supply voltage.

4. The integrated circuit of claim 1, further comprising:
   a second power supply modulator, coupled to the second sub-circuit, the second modulator modulating the second power supply voltage without modulating the first power supply voltage.

5. The integrated circuit of claim 1, further comprising:
   an output identifier, coupled to the first sub-circuit, that identifies an actual output of the first-sub-circuit while the first power supply modulator modulates the first power supply voltage; and
   a comparator, coupled to the output identifier, that compares the actual output to an expected output of the first sub-circuit.

6. The integrated circuit of claim 1, wherein the at least one first shunt comprises at least one transistor.

7. The integrated circuit of claim 1, wherein the first shunt controller comprises means for activating the at least one first shunt for a first predetermined period of time.

8. The integrated circuit of claim 1, further comprising:
   a trigger circuit that provides a trigger signal to the first shunt control means; and
   wherein the first shunt controller comprises means for activating the at least one first shunt in response to receipt of the trigger signal.

9. The integrated circuit of claim 8:
   wherein the second power supply modulator comprises at least one second shunt coupled to the second power supply rail;
   wherein the integrated circuit further comprises a second shunt controller, coupled to the at least one second shunt, that controls activation of the at least one second shunt;
   wherein the trigger circuit comprises means for providing the trigger signal to the second shunt control means;
   wherein the second shunt controller comprises means for activating the at least one second shunt in response to receipt of the trigger signal.

10. The integrated circuit of claim 8, further comprising:
    delay means, coupled between the trigger circuit and the first shunt controller, for delaying the trigger signal by a predetermined delay and for providing the delayed trigger signal to the first shunt controller; and
    wherein the first shunt controller comprises means for activating the at least one first shunt in response to receipt of the delayed trigger signal.

11. An integrated circuit comprising:
    a first sub-circuit coupled to a first power supply rail providing a first power supply voltage;
    a second sub-circuit coupled to a second power supply rail providing a second power supply voltage;
    a first plurality of shunts coupled to the first power supply rail and to the first sub-circuit to modulate the first power supply voltage without modulating the second power supply voltage;
    first shunt control means, coupled to the first plurality of shunts, for activating a predetermined subset of the first plurality of shunts for a first predetermined period of time in response to receipt of a trigger signal;
    output identification means, coupled to the first sub-circuit, for identifying an actual output of the first-sub-circuit while the first power supply modulation means modulates the first power supply voltage; and
    comparison means, coupled to the output identification means, for comparing the actual output to an expected output of the first sub-circuit.

12. A method for use of an integrated circuit including a first sub-circuit coupled to a first power supply rail providing a first power supply voltage and a second sub-circuit coupled to a second power supply rail providing a second power supply voltage, the method comprising steps of:
    (A) receiving a trigger signal; and
    (B) in response to receipt of the trigger signal, modulating the first power supply voltage without modulating the second power supply voltage, wherein the modulating comprises activating a predetermined subset of a first plurality of shunts.

13. The method of claim 12, wherein the step (B) comprises a step of increasing the first power supply voltage.

14. The method of claim 12, wherein the step (B) comprises a step of decreasing the first power supply voltage.

15. The method of claim 12, further comprising a step of:
    (C) in response to receipt of the trigger signal, modulating the second power supply voltage without modulating the first power supply voltage.

16. The method of claim 12, wherein the step (B) comprises a step of modulating the first power supply voltage by a first amount, and wherein the step (C) comprises a step of modulating the second power supply voltage by a second amount which differs from the first amount.

17. The method of claim 15, wherein the step (B) comprises a step of modulating the first power supply voltage for a first period of time, and wherein the step (C) comprises a step of modulating the second power supply voltage for a second period of time which differs from the first period of time.

18. The method of claim 15, wherein steps (B) and (C) are performed contemporaneously.

19. The method of claim 12, further comprising steps of:
(C) identifying an actual output of the first-sub-circuit while the step (B) is being performed; and
(D) comparing the actual output to an expected output of the first sub-circuit.

20. The method of claim 12, wherein the step (B) comprises a step of activating at least one first shunt for a first predetermined period of time, the at least one first shunt being coupled to the first power supply rail.

21. A method for use of an integrated circuit including a first sub-circuit coupled to a first power supply rail providing a first power supply voltage and a second sub-circuit coupled to a second power supply rail providing a second power supply voltage, the method comprising steps of:
(A) receiving a trigger signal;
(B) in response to receipt of the trigger signal, modulating the second power supply voltage; and
(C) prior to the step (B), delaying the trigger signal by a predetermined delay to produce a delayed trigger signal;
wherein the step (A) comprises a step of receiving the delayed trigger signal; and
wherein the step (B) comprises a step of modulating the first power supply voltage without modulating the second power supply voltage in response to receipt of the delayed trigger signal.

22. A method for use of an integrated circuit including a first sub-circuit coupled to a first power supply rail providing a first power supply voltage and a second sub-circuit coupled to a second power supply rail providing a second power supply voltage, the method comprising steps of:
(A) receiving a trigger signal;
(B) in response to receipt of the trigger signal, activating a subset of a first plurality of shunts for a first predetermined period of time to modulate the first power supply voltage by a first amount; and
(C) in response to receipt of the trigger signal, activating a subset of a second plurality of shunts for a second predetermined period of time to modulate the second power supply voltage by a second amount which differs from the first amount;
wherein the steps (B) and (C) are performed contemporaneously.

* * * * *

UNITED STATES PATENT AND TRADEMARK OFFICE
CERTIFICATE OF CORRECTION

| | | |
|---|---|---|
| PATENT NO. | : 7,321,482 B2 | Page 1 of 1 |
| APPLICATION NO. | : 10/804624 | |
| DATED | : January 22, 2008 | |
| INVENTOR(S) | : Don Douglas Josephson et al. | |

It is certified that error appears in the above-identified patent and that said Letters Patent is hereby corrected as shown below:

In column 11, line 18, in Claim 21, after "modulating" insert -- the first power supply voltage without modulating --.

Signed and Sealed this

Third Day of June, 2008

JON W. DUDAS
*Director of the United States Patent and Trademark Office*